United States Patent [19]

Shiba et al.

[11] 4,165,237
[45] Aug. 21, 1979

[54] SILVER HALIDE LIGHT-SENSITIVE MATERIAL

[75] Inventors: Keisuke Shiba, Shizuoka; Tatsuya Tajima, Minami-ashigara; Hirokazu Sakaki, Shizuoka, all of Japan

[73] Assignee: Fuji Photo Film Co., Ltd., Minami-ashigara, Japan

[21] Appl. No.: 687,424

[22] Filed: May 17, 1976

[30] Foreign Application Priority Data

May 16, 1975 [JP] Japan ................................. 50/59025

[51] Int. Cl.² .................... G03C 1/48; G03C 1/84; G03C 5/54
[52] U.S. Cl. .................... 96/76 R; 96/29 L; 96/84 R
[58] Field of Search ............ 96/84 R, 76 R, 67, 29 L

[56] References Cited

U.S. PATENT DOCUMENTS

| 2,882,151 | 4/1959 | Yutzy et al. | 96/76 R |
| 3,411,907 | 11/1968 | Whitmore et al. | 96/67 |
| 3,424,584 | 1/1969 | Cook | 96/76 R |
| 3,656,954 | 4/1972 | Thiers et al. | 96/50 PL |
| 3,697,277 | 10/1972 | King | 96/50 PL |
| 3,728,124 | 4/1973 | Whyte | 96/84 R |
| 3,904,412 | 9/1975 | Serrien et al. | 96/29 L |

Primary Examiner—Richard C. Schilling
Attorney, Agent, or Firm—Sughrue, Rothwell, Mion, Zinn and Macpeak

[57] ABSTRACT

A silver halide light-sensitive material in which a silver halide light-sensitive emulsion layer is provided on a support permanently provided with a spectral reflectance of about 25% or less in the light-sensitive wavelength region of the silver halide light-sensitive emulsion layer. A method of utilizing the same in a diffusion transfer process is also disclosed.

15 Claims, 4 Drawing Figures

SILVER HALIDE LIGHT-SENSITIVE MATERIAL

BACKGROUND OF THE INVENTION

1. Field of the Invention

This invention relates to a silver halide light-sensitive material, more particularly, to a silver halide light-sensitive material which is specially designed to faithfully reproduce images and letters and to methods involving the same.

2. Description of the Prior Art

Silver halide light-sensitive materials which have an antihalation layer for improving the sharpness of images have hitherto been known. However, antihalation layers known so far are decolorized or stripped in the course of development, and methods of providing these antihalation layers have some defects. One of defect is that the dyes used for preventing halation contaminate processing solutions and washing water, and, thus, are liable to cause environmental pollution. Another defect is that since an antihalation layer having very low spectral reflectance can only be prepared using a high concentration of a soluble dye, an adjacent silver halide emulsion layer is desensitized or is rendered soft in contrast thereby.

SUMMARY OF THE INVENTION

One object of this invention is to overcome the above defects.

Another object of this invention to provide a silver halide light-sensitive material which faithfully reproduces letters and images.

A further object of this invention to provide a silver halide light-sensitive material which has wide exposure latitude with variations in the conditions of image-forming processes such as exposure, development and silver salt diffusion transfer.

Yet another object of this invention to provide a silver halide light-sensitive material which causes no water pollution.

It is another object of this invention to provide a silver halide light-sensitive material for use in a diffusion transfer process which faithfully reproduces letters and images and causes no smearing of images during development.

It is yet a further object of this invention to provide a silver halide light-sensitive material useful for the preparation of a printing plate which reproduces letters and halftone images faithfully, and, particularly, clearly, which cannot be obtained by conventional camera speed printing methods.

Yet a further object of the present invention is to provide a silver halide light-sensitive material especially useful for forming an image by diffusion transfer processing.

Still yet a further object of the present invention is to provide a silver halide light-sensitive material useful for forming lithographic printing plates by a diffusion transfer process.

The objects of this invention can be accomplished by using a silver halide light-sensitive emulsion layer which is provided by coating a silver halide light-sensitive emulsion on a support permanently provided with a spectral reflectance of about 25% or less in the light-sensitive wavelength region of the silver halide, which emulsion layer is not decolorized or stripped after development processing.

DETAILED DESCRIPTION OF THE INVENTION

Figure 1A:
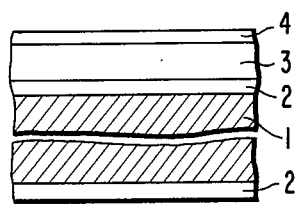
FIGS. 1a and b, respectively, show a cross-sectional view of one embodiment of a silver halide light-sensitive material of this invention, and FIGS. 2a and b, respectively, illustrate a cross-sectional view of the image-receiving material used in the silver salt diffusion transfer process in the Examples.

The support used for the silver halids light-sensitive material of this invention can be obtained by incorporating a coloring agent such as carbon black, pigments such as metal phthalocyanines, etc., or dyes such as anthraquinone dyes, azo dyes, etc., into a plastic film such as cellulose acetate, cellulose acetate butyrate, polyethylene terephthalate or polystyrene, or laminates thereof, or a synthetic paper such as a base paper, a baryta paper or a paper laminated with a plastic film, e.g., an $\alpha$-olefin polymer such as polyethylene, polypropylene, etc.

For example, as the support, there can be used a raw paper having added thereto carbon black or a pigment or dyed with a dye, the above base paper laminated with polyethylene, a plastic film such as cellulose triacetate, polyethylene terephthalate, polycarbonate, etc., having added thereto carbon black or a pigment, or a raw paper laminated with the above plastic film. Moreover, supports which are coated with a colloidal solution containing a dispersed dye that is fixed on a mordant such as a polymer having an ammonium group, an onium group, etc., or a colloidal solution containing carbon black or a pigment such as metal phthalocyanines, etc., mixed therein can be used. In general, the pigments or dyes utilized in the present invention are those which can be dispersed in the support or in a colloidal layer which is to be coated thereon and which are not decolored or removed by a processing solution during photographic processing. Pigments or dyes which illustrate these characteristics can be used with success in the present invention, and include those materials as exemplified above, most preferably, carbon black, a triphenylmethane dye, an anthraquinone dye or an azo dye; carbon black per se is most often used.

Most preferred supports for utilization in the present invention are cellulose triacetate, polyethylene terephthalate, paper and paper having laminated thereto a plastic film, most preferably a thin film of an $\alpha$-olefin such as polyethylene, polyprropylene, and the like.

With respect to the spectral reflectance, the value in the light-sensitive wavelength region of a silver halide light-sensitive emulsion layer is measured using an automatic recording spectrophotometer. Most preferably, the light-sensitive wavelength region of the silver halide is from about 300 m$\mu$ to about 700 m$\mu$, though this is not limitative.

The silver halide light-sensitive layer of this invention can be obtained by coating a silver halide light-sensitive emulsion on a support of the above type.

The silver halide emulsions which can be used include any type of emulsions such as silver chloride, silver bromide, silver bromoiodide, silver chloroiodide and silver chlorobromide. Among these, a silver chlorobromide emulsion is preferred.

The silver halide light-sensitive emulsion layer is preferably provided by coating a silver halide light-sensitive emulsion containing about 150 to about 700 g of one or more binders per 1 mol of silver salt at a silver coverage of about 3.7 to about 20 millimol/1 m$^2$ on a support permanently provided with a spectral reflectance of about 25% or less in the light-sensitive wavelength region of the silver halide.

The thickness of the silver halide light-sensitive emulsion layer of the present invention is not particularly limited in any fashion, but is preferably from about 0.1 to about 10µ, even more preferably from 0.5 to 6µ.

For remarkable exhibition of excellent effects, the mutual relationship between the spectral reflectance of the surface of the support, the amount of silver coated and the amount of the binder contained in the emulsion layer is important. When the spectral reflectance of the surface of the support is about 25% or less, unexpectedly excellent effects are shown from the viewpoint of the prevention of halation. When the amount of silver coated is more than about 20 millimol/1 m$^2$ or less than about 3.7 millimol/1 m$^2$, the halftone gradation scale is liable to be reproduced over a narrow range of steps, but when the amount of the binder contained in the emulsion layer is about 150 g to about 700 g/1 mol of silver salt, the reproduction range of the halftone gradation scale can be extended. On the other hand, when the amount of the binder contained in the emulsion layer is more than about 150 g, particularly more than 250 g/1 mol, of silver salt, the silver halide light-sensitive material and the image-receiving layer may slip from each other in and be out of alignment on the order of 10µ 100µ in the process of contacting them for diffusion transfer, and, thus, letters and halftone images may not be faithfully reproduced. This defect can be overcome by matting any the surface or the back surface of the silver halide light-sensitive material or the image-receiving layer-coated surface of the image-receiving material.

To protect the above silver halide emulsion layer, a protective layer is generally provided thereon. To form the protective layer, there can be used gelatin and resins such as carboxymethyl cellulose, polyvinyl alcohol and polyvinyl pyrrolidone, etc. In addition, the protective layer can be matted by adding a matting agent thereto or by a mechanical method. The matting agent used includes particles of inorganic substances such as silica, glass, carbonates of alkaline earth metals, zinc carbonate or exposed silver halides and particles of organic substances such as starch, polystyrene, polymethacrylate or polycarbonate. It is to be noted in this regard that layers other than a protective layer can be present on the emulsion layer, for example, there can be present a light-shielding layer, a peelable layer which can be easily peeled off, and the like. Further, there can also be present layers between the support and the light-sensitive emulsion layer, for example, a undercoating (or subbing) layer, an intermediate layer and a layer containing a developing agent or the like.

The silver halide light-sensitive material of this invention finds wide applications as a material used for recording letters and images, or as a master material used for duplication of letters and images. For example, this invention is applicable for stripping films, printing plates using silver halides, negative light-sensitive materials used in a diffusion transfer process, or negative light-sensitive units (including a color light-sensitive material) for use in instant photography which are based upon diffusion transfer.

In a diffusion transfer process, a silver halide light-sensitive material is exposed to form an image in the light-sensitive layer thereof, and the thus exposed element is developed by contacting the same with a treating solution containing a developer.

In this development, the exposed silver halide in the light-sensitive layer is reduced (or developed) to form non-diffusible silver deposits. Simultaneously with or subsequent to development, when the light-sensitive element is contacted with a water soluble silver complex forming agent the silve halide which has not been exposed is reacted with the complex forming agent to form a water soluble silver complex. At this stage, when an image receiving element which consists of a layer (that is, an image receiving layer) containing a dispersion wherein a substance which is a catalyst for the reduction of the water soluble silver complex (or silver depositing nuclei, that is, so-called physical development nuclei) is dispersed in a hydrophilic binder and closely contacted with the light-sensitive layer, the silver complex formed in the light-sensitive layer is diffused from the light-sensitive layer to the image receiving layer, and reduced to silver in the image receiving layer by the action of the development nuclei.

Positive images can also be produced through diffusion transfer as described above by placing an image-receiving material so as to be substantially adjacent to the emulsion layer of the silver halide light-sensitive material of this invention. The image-receiving material comprises a support on which deposited silver nuclei are directly absorbed or applied dispersed in a binder. The deposited silver nuclei used include colloidal particles known as physical development nuclei, e.g., noble metals such as gold, platinum, palladium or silver, heavy metals such as cadmium, lead, zinc or nickel, or sulfides of these metals, and colloidal particles such as sulfur. As the binder therefor, there can be used hydrophilic colloids used for silver halide light-sensitive emulsions e.g., natural or synthetic hydrophilic polymers such as gelatin derivatives, cellulose materials such as carboxymethyl cellulose, starch derivatives such as sodium alginate, polyvinyl alcohol, polyvinyl pyrrolidone, acrylic acid polymers, acrylic acid copolymers, etc., and inorganic salts such as silicates or colloidal silica. The support used for the image-receiving material of this invention includes plastic films such as polyethylene terephthalate, polypropylene or cellulose acetate, papers laminated with the above plastic films, resin-impregnated papers, synthetic papers, raw papers, metallic sheets such as aluminum, zinc, copper or chromium, and metallized papers, i.e., papers having a thin layer of a metal vacuum deposited thereon. The support used for the image-receiving material is selected depending upon the purpose for which this invention is applied. For example, for the preparation of instant photographs, water-proof papers in which paper is laminated with polyethylene containing a white pigment such as titanium oxide, barium sulfate, etc., are used. For the preparation of white base papers and printing plates used for office copying, cellulose acetate films which are treated so as to be rendered hydrophilic, water-proof papers which are treated so as to be rendered hydrophilic, aluminum-coated water-proof papers, and the like can be used. In particular, for the purpose of preparing printing plates, aluminum plates are preferably used. The surface of the aluminum plate may be smooth or grained. Preferably a surface anodized in a mineral acid is used. Moreover, it may be treated so as to be rendered hydrophilic, e.g., subjected to a silicate treatment as is described in U.S. Pat. No. 2,714,066.

Figure 2A:
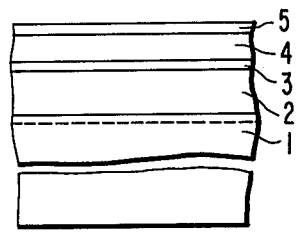

If desired, a protective layer can be provided on the image-receiving layer of this invention. As the protective layer, hydrophilic polymers which are generally used for conventional light-sensitive emulsions can be used. The protective layer can contain, if desired, a developing agent such as hydroquinone or derivatives thereof of 3-pyrazolidone derivatives, a sensitizer such as onium salts, a solvent for silver halide such as thiosulfates or uracil or an agent to accelerate the stripping of the image-receiving layer such as proteolytic enzyme, depending upon the purpose for which this invention is applied In one embodiment of image-receiving materials used for the preparation of printing plates, image-receiving materials comprising a support having thereon a light-sensitive layer on which an image-receiving layer is provided can be used. In this case, an intermediate layer can be provided between the light-sensitive layer and the image-receiving layer, and a protective layer can be provided on the image-receiving layer. The light-sensitive layer in this case is as used for PS (Pre-Sensitized) plates. For positive working, benzoquinonediazide or o-napthoquinonediazide compounds are used together with a shellac resin, cumarone resin, phenol resin, or the like. For negative working, a polymeric diazonium compound such as a condensate of 4-diazophenylamine and formaldehyde is used together with an epoxy resin or shellac resin, or a light-sensitive polymer such as polyvinyl cinnamate, or the like, is used. As the intermediate layer in this case, polymers such as a condensates of hydantoin and formaldehyde, condensates of hydantoin, guanamine and formaldehyde and condensates of barbituric acid and formaldehyde are used. A typical layer constitution of such an image-receiving material is shown in FIG. 2a. Using the silver halide light-sensitive material of this invention, an excellent positive image can be produced on such an image-receiving material by a diffusion transfer process. Subsequently, ultraviolet rays can be applied through the positive silver image, and then a printing plate can be obtained after a series of processings such as stripping of the image-receiving layer, developing as is used for PS plates, and drying and coating a gum thereon, such as gum arabic.

The present invention finds particular application with diffusion transfer processes as are described in Photographic Silver Halide Diffusion Processes, published by The Focal Press, N.Y. (1972).

The silver halide light-sensitive material of this invention can be developed using a monobath developer when used for diffusion transfer process. The monobath developer typically contains a developing agent, a silver halide solvent and an alkali agent, and if desired, an antifogging agent and a sensitizer. Some of the above components can also be previously incorporated in the light-sensitive material or the image-receiving material, if desired. The silver halide light-sensitive material of this invention can be developed using a developer of the activator type by previously incorporating the developing agent, and, if desired or necessary, other development auxiliaries in either of the light-sensitive material or the image-receiving material.

Various advantages of the silver halide light-sensitive material of this invention will now be discussed.

One advantage is that the light-sensitive material of this invention does not contaminate processing solutions and washing water since it uses such a highly colored support that coloring agents are not dissolved out during development.

Secondly, the support used in this invention can easily be highly colored since there is no necessity to completely decolorize it after processing. Therefore, the silver halide light-sensitive material of this invention can easily be prepared at low cost. When such a light-sensitive material prepared by providing a silver halide light-sensitive emulsion on a support having a highly colored surface of a spectral reflectance of about 25% or less, most preferably not more than 10%, in the light-sensitive wavelength region is used, useful effects are shown which could not be expected in the case of using usually known antihalation layers.

Thirdly, when the light-sensitive material of this invention is used, the characteristic curve of the images produced, particularly, a micro-image of about 10 to about 1000 microns, shows remarkably high contrast, and, as a result, letters and halftone images can be faithfully reproduced.

Fourthly, by using the light-sensitive material of this invention, lowered reproducibility of the results due to variations in various conditions of image-forming processes such as exposure, development and silver salt diffusion transfer is remarkably avoided.

Fifthly, unevenness of images due to the coating of an emulsion, development, diffusion transfer and the like does not result. The above excellent effects are particularly shown in a silver salt diffusion transfer process.

The following Examples further illustrate this invention but are not intended to limit it. In the following Examples, unless other wise indicated, the silver salt used was silver chlorobromide (50/50 mol% Cl and Br), the binder used was gelatin and when a matting agent is stated as being added to a protective layer, it comprised a 5% colloidal solution of silica.

EXAMPLE 1

(1) Preparation of silver halide light-sensitive material

A support (having a spectral reflectance of 7% at 500 m$\mu$) comprising a black base paper (1 shown in FIG. 1a) which was laminated with polyethylene layers (2 shown in FIG. 1a) of 15$\mu$ thickness was subjected to a corona discharge treatment. 1 kg of a silver chlorobromide base emulsion (containing 50 mol % of silver bromide, 50 mol % of silver chloride and 510 g of gelatin as a binder / 1 mol of silver salt and having an average particle size of 0.45$\mu$) was melted, and the additives shown below were added to obtain finished emulsion - I. Finished emulsion - I was coated at a silver coverage of 10 millimol/1 m$^2$ on the support to form an emulsion layer (3 shown in FIG. 1a).

| Finished Emulstion - I | |
|---|---|
| silver chlorobromide base emulsion | 1 kg |
| 1,3-diethyl-5-[(3-ethylpyrrolinylidene)-ethylidene]-thiohydantoin | |
| (0.025% methanol solution) | 10 ml |
| 5-bromobenzotriazole (2% methanol solution) | 3 ml |
| saponin (6% aqeuous solution) | 8 ml |
| resorcin (5% aqueous solution) | 20 ml |
| formaldehyde (6% aqueous solution) | 30 ml |

Further, 100 parts of a 2% gelatin solution was mixed with 40 parts of a 5% colloidal solution of silica, and the resulting solution was coated to provide a dry coating thickness of 1$\mu$ and dried to form a protective layer (4 shown in FIG. 1a).

(2) Preparation of image-receiving material (sample - A)

An aluminum sheet (1 shown in FIG. 2a) 0.24 mm thick was immersed in a 5 wt% aqueous solution of trisodium phosphate at 30° C. for 2 minutes. It was then abraded with a brush and washed with water, whereafter it was immersed in a 70 wt% aqueous solution of nitric acid at 30° C. for 1 minute and washed with water. Thereafter, it was immersed in 2 wt% sodium silicate JIS No. 3 sodium silicate (the mole ratio of $SiO_2$ to $Na_2O$ was about 3.2) at 30° C. for 2 minutes, washed with water and then dried. Onto the resulting support, sensitizing solution - I having the following composition was coated in a coating amount of 2.5 g/1 m² using a whirler and dried to form a light-sensitive layer (2 shown in FIG. 2a).

| Sensitizing Solution - I | |
| --- | --- |
| naphthoquinone-(1,2)-diazide (2)-5-sulfonic acid ester of polyoxyphenol obtained using a condensate of acetone and pyrogallol | 2 parts by weight |
| cresol-formaldehyde novolak type resin* | 4 parts by weight |
| ethylene glycol monomethyl ether | 100 parts by weight |

*obtained by the reaction of 7 moles of a phenol and not more than 6 moles of aldehyde (preferably 5 to 6 moles of aldehyde).

Next, a 0.5 wt% solution of a condensate of dimethylhydantoin and acetoquanamine with formaldehyde (0.5 wt% acetoquanamine based on dimethylhydantoin; equimolar dimethylhydantoin to formaldehyde) in a solution of n-propanol (2 volume parts) and methanol (1 volume part) was coated at a condensate amount of 0.3 g/1 m² as an intermediate layer (3 shown in FIG. 2a) and dried.

5 parts by volume of 0.1 N solution of sodium sulfide and 5 parts by volume of a 0.1 N solution by silver nitrate were simultaneously added to 100 parts by volume of a 3% aqueous solution of gelatin while thoroughly stirring at 40° C. to form an emulsion containing silver sulfide nuclei dispersed therein in a colloidal state (0.5μ or less). The emulsion was coated on the intermediate layer so as to provide a dry film thickness of 10μ using a whirler and dried to obtain an image-receiving layer (4 shown in FIG. 2a).

Then, 2 parts by volume of 6% aqueous solution of saponin was added to 100 parts by volume of 2 wt% aqueous solution of carboxymethyl cellulose, which was coated as a protective layer (5 shown in FIG. 2a) in a coating amount of 0.5 g/1 m² on the image-receiving layer and dried. A printing original plate having a image-receiving layer was thus obtained.

The silver halide light-sensitive material of this invention and the image-receiving material thus obtained were used in the following manner. An original in which letters and a halftone stepped scale (11 steps, i.e., 5, 10, 20, . . . 90 and 95% in area ratio), which was dotted using a contact screen with 85 lines/inch, were patched up using a photocomposing paper made by Fuji Photo Film Co., Ltd., was photographed by means of a process camera under conditions of equal magnification, a diaphragm opening of f=32 and 40 seconds. Development was effected at 27° C. for 10 seconds using developer - I having the following composition, and then the light-sensitive material thus processed was put into contact with the image-receiving material - I for 20 seconds to diffusion transfer the image, thus obtaining a positive image produced on the image-receiving material.

| Developer - I | |
| --- | --- |
| hydroquinone | 15 g |
| 1-phenyl-pyrazolidone | 1 g |
| anhydrous sodium sulfite | 80 g |
| sodium thiosulfate | 12 g |
| sodium hydroxide | 15 g |
| water to make | 1 liter |

Exposure to light was effected for 25 seconds through the positive image transferred onto the image-receiving material under the conditions of 25,000 lux and 1 m using a PS-light for use in PS plate printing made by Fuji Photo Film Co., Ltd. (using a metal halide lamp). The image-receiving layer was then removed with warm water at 40° C. to obtain a printing plate having an image. The printing plate was used for printing by means of a printing press (ROTAPRINT R-40/K-30) to obtain 100,000 good prints. For comparison, the following samples were prepared.

| | Sample-1 | Sample-2 | Sample-3 (for comparison) | Sample-4 (for comparison) |
| --- | --- | --- | --- | --- |
| Support (spectral reflectance at 500 mμ) | polyethylene-laminated black paper (7%) | black polyethylene laminated paper (3%) | baryta paper (92%) | polyethylene-laminated white paper (88%) |
| Amount of Silver Coated (millimol/m²) | 10 | 13 | 10 | 23 |
| Binder (g/1 mol of silver salt) | 510 | 510 | 510 | 120 |
| Matting Agent | containing silica | containing silica | containing silica | containing silica |

The above samples were treated in the same manner as above described. The obtained transfer images and the corresponding images produced using the printing plates were observed, and the following results were obtained.

Sample - 1 With respect to the halftone stepped scale, the steps of 5 to 80% area ratio of the original were reproduced, and letters of class 7 were sharply reproduced.

Sample - 2 With respect to the halftone stepped scale, the steps of 5 to 90% of the original were reproduced, and letters of class 7 were sharply reproduced. Even when the time for developing the silver salt was varied from 5 to 30 seconds, letters of class 7 were faithfully reproduced.

Sample - 3 (for comparison) The same treatment as for Sample - 1 was effected except for photographing by means of a process camera using a diaphragm opening of f=32 and an exposure time of 17 seconds. In this case, with the halftone gradation scale, only the steps of 5 to 60% were reproduced, and letters of class 7 tended to disappear. When the exposure time was set at 13 seconds to faithfully reproduce the letters of class 7, only the steps of 5 to 50% were reproduced, and, thus, the scale reproduced became still narrower.

Sample - 4 (for comparison) Regarding this sample, only the steps of 10 to 60% were reproduced as to the halftone gradation scale. When the exposure time was shortened to reproduce the step of 5%, letters of class 7 were filled up, and the trouble of smearing occurred.

EXAMPLE 2

(1) Preparation of silver halide light-sensitive material 1 kg of a silver chlorobromoiodide base emulsion (containing 60 mol% of silver chloride, 39.9 mol% of silver bromide and 0.1 mol% of silver iodide, having an average particle size of $0.35\mu$ and containing 255 g of a binder per 1 mol of silver salt) was melted, and the following additives were added thereto to obtain a finished emulsion - II.

| Finished Emulsion - II | |
| --- | --- |
| silver chlorobromoiodide base emulsion | 1 kg |
| 1-ethyl-3-phenyl-5-[4'-(δ-sulfobutyl)-pyridylidene]-thiohydantoin (0.05% methanol solution) | 20 ml |
| 1-phenyl-5-mercaptotetrazole (1% methanol solution) | 2 ml |
| saponin (6% aqueous solution) | 10 ml |
| hydroquinone (10% aqueous solution) | 10 ml |
| 2-hydroxy-4,6-dichloro-1,3,5-triazine (2% aqueous solution) | 20 ml |

The thus prepared finished emulsion - II was coated on the same support as was used in Sample - 1 in a silver amount of 8 mol/m$^2$.

(2) Preparation of image-receiving material (sample - B)

A 2S aluminum sheet 0.3 mm thick was immersed for 1 minute in a 5 wt% aqueous solution of trisodium phosphate heated to 70° C., thus degreasing the sheet. It was then washed with water, abraded with a brush, again washed with water and anodized in a 20 wt% aqueous solution of sulfuric acid at 30° C. at a current density of 1 Amp/dm$^2$ for 5 minutes. Onto the resulting aluminum sheet, sensitizing solution - I shown in Example 1 was coated in the same manner, and a condensate of dimethylhydantoin, acetoquanamine and formaldehyde (0.5 wt% acetoquanamine based on dimethylhydantoin; equimolar dimethylhydantoin to formaldehyde) was coated thereon as an intermediate layer in a coating amount of 0.1 g/m$^2$ and then dried.

To 100 parts by volume of 3% aqueous solution of gelatin, 10 parts by volume of a 0.1 N aqueous solution of nickel chloride and 5 parts by volume of a 0.1 N aqueous solution of sodium sulfide were added while stirring well at 40° C., and 50 parts of n-propyl alcohol was further added. The resulting solution was coated in a coating amount of 0.5 g/m$^2$ on the intermediate layer and then dried to form an image-receiving layer. Thereafter, 100 parts by volume of a 1% aqueous solution of carboxymethyl cellulose (Metrose Type 90 SH produced by Shinetsu Chemical Ind. Co., Ltd.) was mixed with 50 parts by volume of n-propyl alcohol, and 5 parts of a 10 wt% solution of sodium benzenesulfinate was further added thereto. The resulting solution was coated in a coating amount of 0.3 g/m$^2$ on the image-receiving layer and dried to obtain an image-receiving material (sample - B).

The original used in Example 1 was photographed by means of a process camera under conditions of equal magnification, a diaphragm opening of F=32 and an exposure time of 17 seconds, and, then, the same processing as in Example 1 was effected to obtain a printing plate.

The resulting printing plate was used for printing using a printing press (HEIDELBELG KOR) to obtain more than 100,000 good prints. With respect to the halftone gradation scale, the steps of 5 to 90% were faithfully reproduced, and letters of class 7 were sharply reproduced.

EXAMPLE 3

(1) Preparation of silver halide light-sensitive material

To 1 kg of a high speed gelatin silver bromoiodide emulsion which had been gold- and sulfur-sensitized (containing 5 mol% of silver iodide and 504 g of a binder per 1 mol of silver salt; having an average particle size of $0.6\mu$), the following additives were added to obtain finished emulsion - III.

| Finished Emulsion - III | |
| --- | --- |
| silver bromoiodide base emulsion (melted) | 1 kg |
| 3,3'-diethyl-9-methylthiacarbocyanine bromide (0.1% methanol solution) | 15 ml |
| 4-hydroxy-6-methyl-1,3,3a,7-tetrazaindene | 0.085 g |
| chrome alum (5% aqueous solution) | 3 ml |
| 2,4-dichloro-6-hydroxy-1,3,5-triazine sodium salt (4% aqueous solution) | 12 ml |
| saponin (2% aqueous solution) | 4 ml |
| polyalkylene oxide (molecular weight: 1368) (2% aqueous solution) | 5 ml |

Figure 1B:
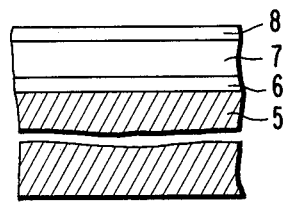

Carbon black was dispersed in finished emulstion - III, which was then coated at a silver coverage of 1.87 g/m$^2$ on a cellulose triacetate film (5 shown in FIG. 1b) which had thereto applied a subbing layer about $0.2\mu$ thick (6 shown in FIG. 1b) to form an emulsion layer (7 shown in FIG. 1b). Moreover, a protective layer about $0.2\mu$ thick (8 shown in FIG. 1b) was provided thereon to form sample - 6. The spectral reflectance of the support was 12%.

(2) Preparation of image-receiving material (sample - C)

Figure 2B:
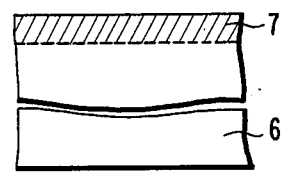

A solution having the following composition was coated on a baryta paper (6 shown in FIG. 1b) and dried to form an image-receiving layer of a thickness of about $2\mu$ (7 shown in FIG. 2b), whereby, an image-receiving material (sample - C) was obtained.

| Silica gel (mean particle size about 10–20 m$\mu$.) | 300 g |
| --- | --- |
| sodium sulfide (1% aqueous solution) | 2800 ml |
| cadmium acetate dihydrate | 30 g |
| water | 100 ml |

The light-sensitive material was cut and placed in a 2B camera, and the original described in Example 1 was photographed in room light under the condition of a diaphragm opening of f=8 and 1/60 of a second. Thereafter, the image-receiving material (sample - C) was subjected to diffusion transfer at room temperature (25° C.) for 15 seconds using developer - II having the following composition.

| Developer - II | |
| --- | --- |
| carboxymethylcellulose (Metrose Type 90 SH produced by Shinetsu Chemical Ind. Co., Ltd.); sodium salt thereof | 42 g |
| sodium thiosulfate | 76 g |
| potassium sulfite | 30 g |
| potassium hydroxide | 36 g |
| tert-butylhydroquinone | 35 g |
| water | 700 ml |

As a result, the halftone gradation scale was transferred onto the baryta paper as an image reduced to a size of about ¼ of the original. The steps of 5 to 80% were faithfully reproduced, and letters of class 7 were clearly reproduced.

While the invention has been described in detail and with reference to specific embodiments thereof, it will be apparent to one skilled in the art that various changes and modifications can be made therein without departing from the spirit and scope thereof.

What is claimed is:

1. A silver halide light-sensitive material in which a silver halide light-sensitive emulsion layer containing a binder in an amount of about 150 to about 700 g per 1 mol of silver halide is provided at a silver coverage of about 3.7 to about 20 millimol/1 $m^2$ on a support having a permanent spectral reflectance of about 25% or less in the light-sensitive wavelength region of the silver halide light-sensitive emulsion layer.

2. A silver halide light-sensitive material as defined in claim 1, wherein the surface of the silver halide light-sensitive material carrying the silver halide emulsion layer or the backside of the silver halide light-sensitive material has been matted using a matting agent to prevent said silver halide light-sensitive material and an image receiving layer from slipping from each other during diffusion transfer processing.

3. A silver halide light-sensitive material as defined in claim 1, wherein the surface of the silver halide light-sensitive material carrying the silver halide emulsion layer or the backside of the silver halide light-sensitive material has been matted by mechanical abrasion to prevent said silver halide light-sensitive material and an image receiving layer from slipping from each other during diffusion transfer processing.

4. A silver halide light-sensitive material as defined in claim 1, wherein said support comprises a plastic film having incorporated therein a coloring agent.

5. A silver halide light-sensitive material as defined in claim 4, wherein said coloring agent is carbon black.

6. A silver halide light-sensitive material as defined in claim 4, wherein said coloring agent is a pigment.

7. A silver halide light-sensitive material as defined in claim 4, wherein said coloring agent is a dye.

8. A silver halide light-sensitive material as defined in claim 1, wherein said support further comprises a colloidal layer containing a pigment or dye which is not decolored or removed in photographic processing.

9. A silver halide light-sensitive material as defined in claim 1, wherein the light-sensitive wave length region of the silver halide light-sensitive emulsion layer is about 300 to about 700 m$\mu$.

10. A silver halide light-sensitive material as defined in claim 9, wherein said spectral reflectance is not more than 10%.

11. The silver halide light-sensitive material of claim 1, in combination with an image receiving element for use in diffusion transfer, wherein upon contact with a water soluble silver complex forming agent following exposure silver halide which has not been exposed forms a water soluble silver complex which transfers to said image receiving element.

12. A silver halide light-sensitive material as defined in claim 1, wherein said silver halide light-sensitive emulsion layer contains a binder in an amount of 250 to 740 g per one mol of the silver halide.

13. A silver halide light-sensitive material as defined in claim 12, wherein said silver halide light-sensitive emulsion layer has a thickness of about 0.1 to about 10$\mu$.

14. A silver halide light-sensitive material as defined in claim 12, wherein said silver halide light-sensitive emulsion layer has a thickness of 0.5 to 6$\mu$.

15. A silver halide light-sensitive material as defined in claim 1, wherein said support comprises a black base paper having laminated thereto polyethylene layers of 15$\mu$ thickness, said support having a spectral reflectance of 7% at 500 m$\mu$.

* * * * *